US006779074B2

(12) United States Patent
Janzen

(10) Patent No.: US 6,779,074 B2
(45) Date of Patent: Aug. 17, 2004

(54) MEMORY DEVICE HAVING DIFFERENT BURST ORDER ADDRESSING FOR READ AND WRITE OPERATIONS

(75) Inventor: Jeffery W. Janzen, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 423 days.

(21) Appl. No.: 09/905,004

(22) Filed: Jul. 13, 2001

(65) Prior Publication Data

US 2003/0018845 A1 Jan. 23, 2003

(51) Int. Cl.[7] .............................................. G06F 12/00
(52) U.S. Cl. ...................... 711/105; 711/217; 711/167; 710/35
(58) Field of Search ................................ 711/105, 217, 711/167; 710/35

(56) References Cited

U.S. PATENT DOCUMENTS

| 5,749,086 A | 5/1998 | Ryan |
| 5,784,705 A | 7/1998 | Leung |
| 5,850,368 A | 12/1998 | Ong et al. |
| 5,903,496 A | 5/1999 | Kendall et al. |
| 5,917,760 A | 6/1999 | Millar |
| 5,940,875 A | 8/1999 | Inagaki et al. |
| 5,966,724 A | 10/1999 | Ryan |
| 6,640,266 B2 * | 10/2003 | Arcoleo et al. ............... 710/35 |

* cited by examiner

Primary Examiner—Mano Padmanabhan
Assistant Examiner—Mehdi Namazi
(74) Attorney, Agent, or Firm—Thorp Reed & Armstrong, LLP

(57) ABSTRACT

An addressing scheme and associated hardware allows for two different types of access, one for reading and one for writing, to take place. A memory device constructed according to the invention comprises a plurality of arrays of memory cells. Peripheral devices are provided for reading information out of and for writing information into the plurality of memory cells. The peripheral devices include a reorder circuit responsive to certain address bits for ordering bits received from the plurality of arrays and an address sequencer for routing certain of the address bits to the reorder circuit during a read operation. The method of the present invention comprises reordering a block of n-bit words output from a memory array according to information in certain address bits before outputting at least one n-bit word from a memory device.

24 Claims, 4 Drawing Sheets

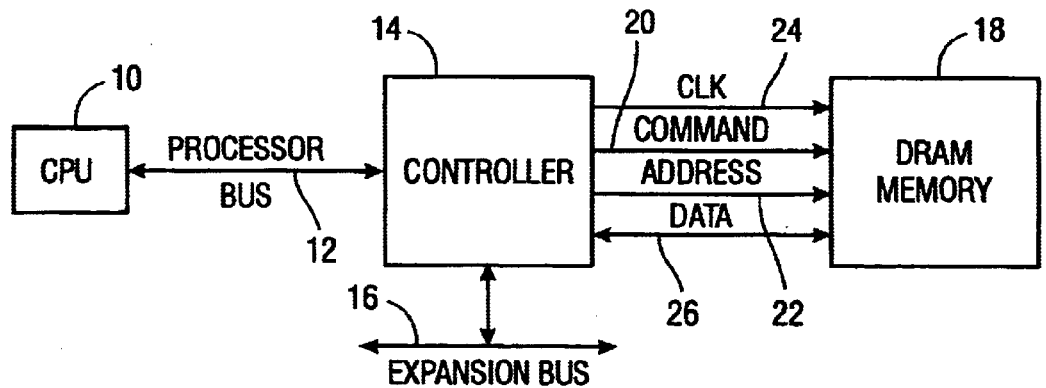

*Prior Art*
Fig.1

| 512M(X4) ADDRESSING | | |
|---|---|---|
| ADD PIN | ROW | COL |
| A13 | | |
| A12 | ROW 12 | |
| A11 | ROW 11 | |
| A10 | ROW 10 | COL 10 |
| A9 | ROW 9 | COL 9 |
| A8 | ROW 8 | COL 8 |
| A7 | ROW 7 | COL 7 |
| A6 | ROW 6 | COL 6 |
| A5 | ROW 5 | COL 5 |
| A4 | ROW 4 | COL 4 |
| A3 | ROW 3 | COL 3 |
| A2 | ROW 2 | COL 2 |
| A1 | ROW 1 | COL 1 |
| A0 | ROW 0 | COL 0 |

Fig.4A

| 512M(X8) ADDRESSING | | |
|---|---|---|
| ADD PIN | ROW | COL |
| A13 | | |
| A12 | ROW 12 | |
| A11 | ROW 11 | |
| A10 | ROW 10 | |
| A9 | ROW 9 | COL 9 |
| A8 | ROW 8 | COL 8 |
| A7 | ROW 7 | COL 7 |
| A6 | ROW 6 | COL 6 |
| A5 | ROW 5 | COL 5 |
| A4 | ROW 4 | COL 4 |
| A3 | ROW 3 | COL 3 |
| A2 | ROW 2 | COL 2 |
| A1 | ROW 1 | COL 1 |
| A0 | ROW 0 | COL 0 |

Fig.4B

| 512M(X16) ADDRESSING | | |
|---|---|---|
| ADD PIN | ROW | COL |
| A13 | | |
| A12 | | |
| A11 | ROW 11 | |
| A10 | ROW 10 | |
| A9 | ROW 9 | COL 9 |
| A8 | ROW 8 | COL 8 |
| A7 | ROW 7 | COL 7 |
| A6 | ROW 6 | COL 6 |
| A5 | ROW 5 | COL 5 |
| A4 | ROW 4 | COL 4 |
| A3 | ROW 3 | COL 3 |
| A2 | ROW 2 | COL 2 |
| A1 | ROW 1 | COL 1 |
| A0 | ROW 0 | COL 0 |

Fig.4C

MEMORY DEVICE HAVING DIFFERENT BURST ORDER ADDRESSING FOR READ AND WRITE OPERATIONS

BACKGROUND OF THE INVENTION

1. Field of the Invention

The present invention is directed to memory devices and, more particularly, to methods and circuits for reading information out of and writing information into the memory device.

2. Description of the Background

Computer designers are continually searching for faster memory devices that will permit the design of faster computers. A significant limitation on a computer's operating speed is the time required to transfer data between a processor and a memory circuit, such as a read or write data transfer. Memory devices such as dynamic random access memories (DRAMs), synchronous dynamic random access memories (SDRAMs), flash memories, etc. typically include a large number of memory cells arranged in one or more arrays, each array comprised of rows and columns. Each memory cell provides a location at which the processor can store and retrieve one bit of data, sometimes referred to as a memory bit or mbit. The more quickly the processor can access the data within the memory cells, the more quickly it can perform a calculation or execute a program using the data.

FIG. 1 shows, in part, a typical computer system architecture. A central processing unit (CPU) or processor 10 is connected to a processor bus 12, which in turn is connected to a system or memory controller 14. The memory controller 14 may be connected to an expansion bus 16. The memory controller 14 serves as interface circuitry between the processor 10 and a memory device 18. The processor 10 issues a command and an address which are received and translated by the memory controller 14. The memory controller 14 applies the translated command signals on a plurality of command lines 20 and the translated address on a plurality of address lines 22 to the memory device 18. These command signals are well known in the art and include, in the case of a DRAM, RAS (row address strobe), CAS (column address strobe), WE (write enable) and OE (output enable). A clock signal is also provided on CLK lines 24. Corresponding to the processor-issued command and address, data is transferred between the controller 14 and the memory 18 via datapath lines 26.

The memory 18 typically comprises a number of memory ranks 27, a representative one of which is illustrated in FIG. 2. In this example, the memory rank 27 is configured for a 64-bit system, having eight 8-bit memory circuits 28(0)–28(7). The command signals RAS, CAS and WE are applied to all memory circuits 28(0)–28(7) in the rank 27. In a memory 18 (FIG. 1) having additional ranks, separate CS command signals would be provided for each rank. Hence, the command signal CS is often referred to as a rank-specific command signal. The address bus 22 is connected to all the memory circuits 28(0)–28(7) in the rank 27 and to all other memory circuits (not shown) in all other ranks (not shown) of the memory 18. Hence, the address bus 22 is often referred to as globally connected.

A synchronous DRAM (SDRAM) is a memory device capable of sequentially accessing, by virtue of internal operations, a certain range of addresses at high speeds. In a typical SDRAM, a read/write rate of 100 Mbytes/sec or greater is possible. To achieve such speeds, the read/write of an SDRAM is performed in a burst mode. Burst mode is a mode of address access where data having the same row addresses are read or written continuously in blocks of 2, 4, or 8 bit words. In addition, the access for such words in the block is made by simply providing the start address of the block. Afterward, the remaining addresses are generated automatically in the SDRAM in accordance with its mode of operation: sequential or interleave. The mode of operation is determined by an address sequence from the CPU. Addresses for each burst address sequence method are generated, in the sequential mode, by addition of the burst start address and an output of an internal counter. In the interleave mode, the addresses are generated by an exclusive OR of the burst start address and an output of an internal counter. The same wrap mode is used for both read and write operations, with all column address bits used for both read and write operations.

As clock speeds increased above 200 MHz (i.e. RDRAM or SLDRAM), the core operation of the DRAM did not increase at the same rate. Therefore, the DRAMs completed the reads and writes on 4 or 8 words internally and then output the word sequentially onto the external bus. As entire groups of data words were being transferred, the least significant column addresses were no longer transmitted to the DRAM.

That solution works well for write data from a controller to the DRAM as it can be aligned to a cache fill. However, because a complete block of data words is transferred at the same time for reads, the most critical word is not always received first by the controller, which can add latency to the system. The need exists for a high clock rate DRAM memory supporting the block transfers of data words while delivering the most critical word first to the controller. Additional need exists for a communication protocol between the memory controller and the DRAM to support such a new feature.

SUMMARY OF THE PRESENT INVENTION

The present invention is an addressing scheme and associated hardware to allow for two different types of access, one for reading and one for writing, to take place. A memory device constructed according to the invention comprises a plurality of arrays of memory cells. Peripheral devices are provided for reading information out of and for writing information into the plurality of memory cells, including:

a reorder circuit responsive to certain address bits for ordering bits received from the plurality of arrays; and an address sequencer for routing certain of the address bits to the reorder circuit during a read operation.

The method of the present invention comprises reordering a block of n-bit words output from a memory array according to information in certain address bits before outputting at least one n-bit word from a memory device. In an exemplary embodiment, the method is for accessing a DRAM and is comprised of the following: using the values on the bank address inputs to select an array bank;

using the column address provided on inputs A3–Ai, where i is the most significant column address;

using the column address provided on inputs A0–A2 to identify a burst order for a read access; and ignoring the column address provided on inputs A0–A2 during a write access. Thus, for reads a specific 8 bit burst is identified by the most significant column address bits while the least significant bits CA0–CA2 identify the most critical word and the read wrap sequence after the critical word. For writes, the burst is identified by the most significant column addresses with CA0–CA2 being "don't care" bits assumed to be 000. Other Implementation schemes are possible An important feature that results from having a read access that differs from the write access is that reads are carried out in a manner so that the critical word is available to the memory controller such that an interleaved burst mode is supported. Writes, on the other hand, can be simplified based on a start sequential burst as the write data may be generated from data held in cache. The present invention supports improved latency for the system by providing the memory controller with the critical word first. Also, the system does not have to reorder the column address bits between read and write commands. Those, and other advantages and benefits, will be apparent from the Description of the Preferred Embodiments appearing hereinbelow.

BRIEF DESCRIPTION OF THE DRAWINGS

For the present invention to be easily understood and readily practiced, the present invention will now be described, for purposes of illustration and not limitation, in conjunction with the following figures, wherein:

FIG. 1 is a functional block diagram of a computer system architecture as is known in the art;

FIGS. 4A, 4B and 4C illustrate addressing in a 512 megabit ×4 part, ×8 part, and ×16 part, respectively, to identify the wrap start location for the critical word.

DESCRIPTION OF THE PREFERRED EMBODIMENTS

Figure 2:
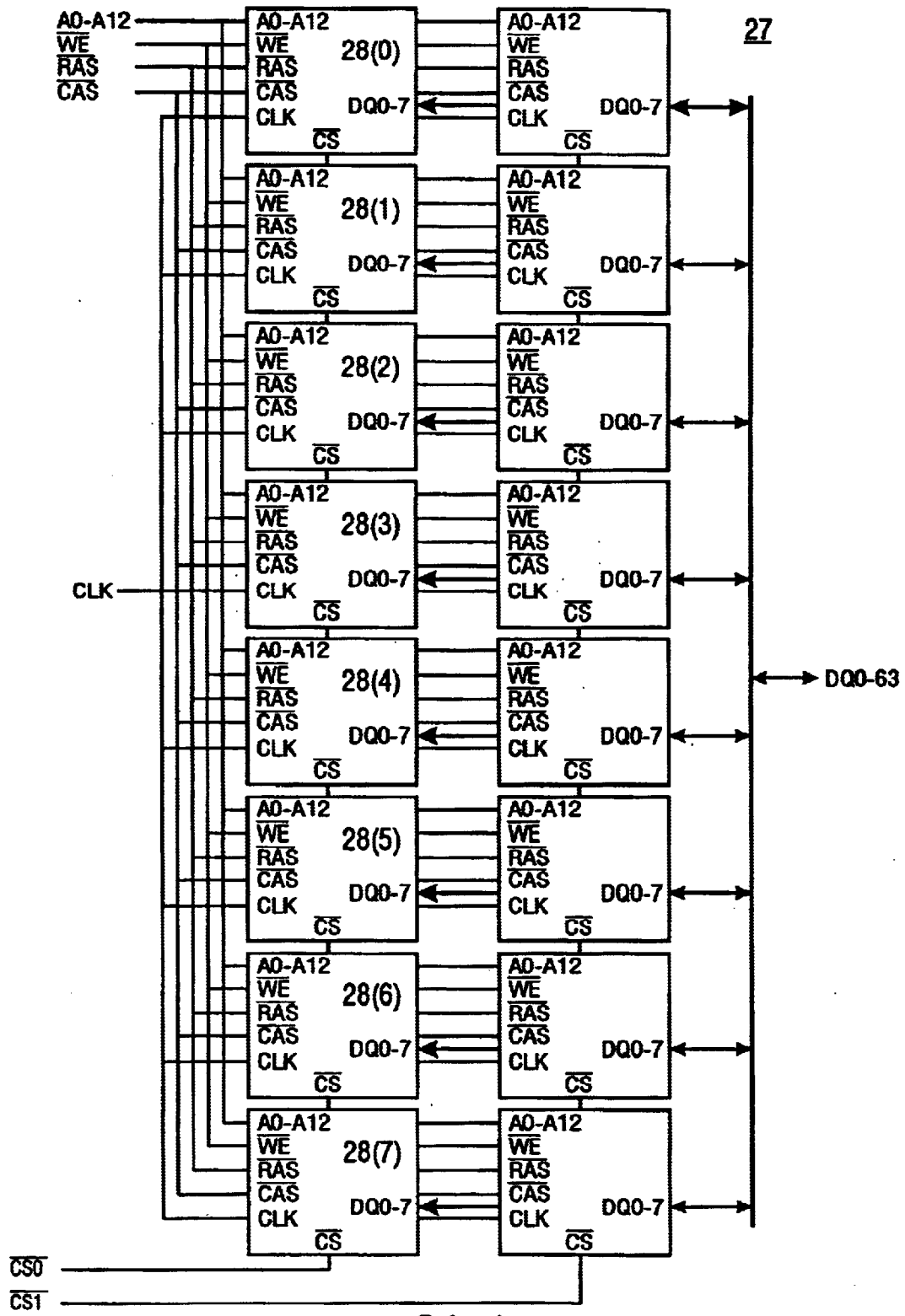
FIG. 2 is a block diagram of a bank of memory circuits as is known in the art.
Figure 3:
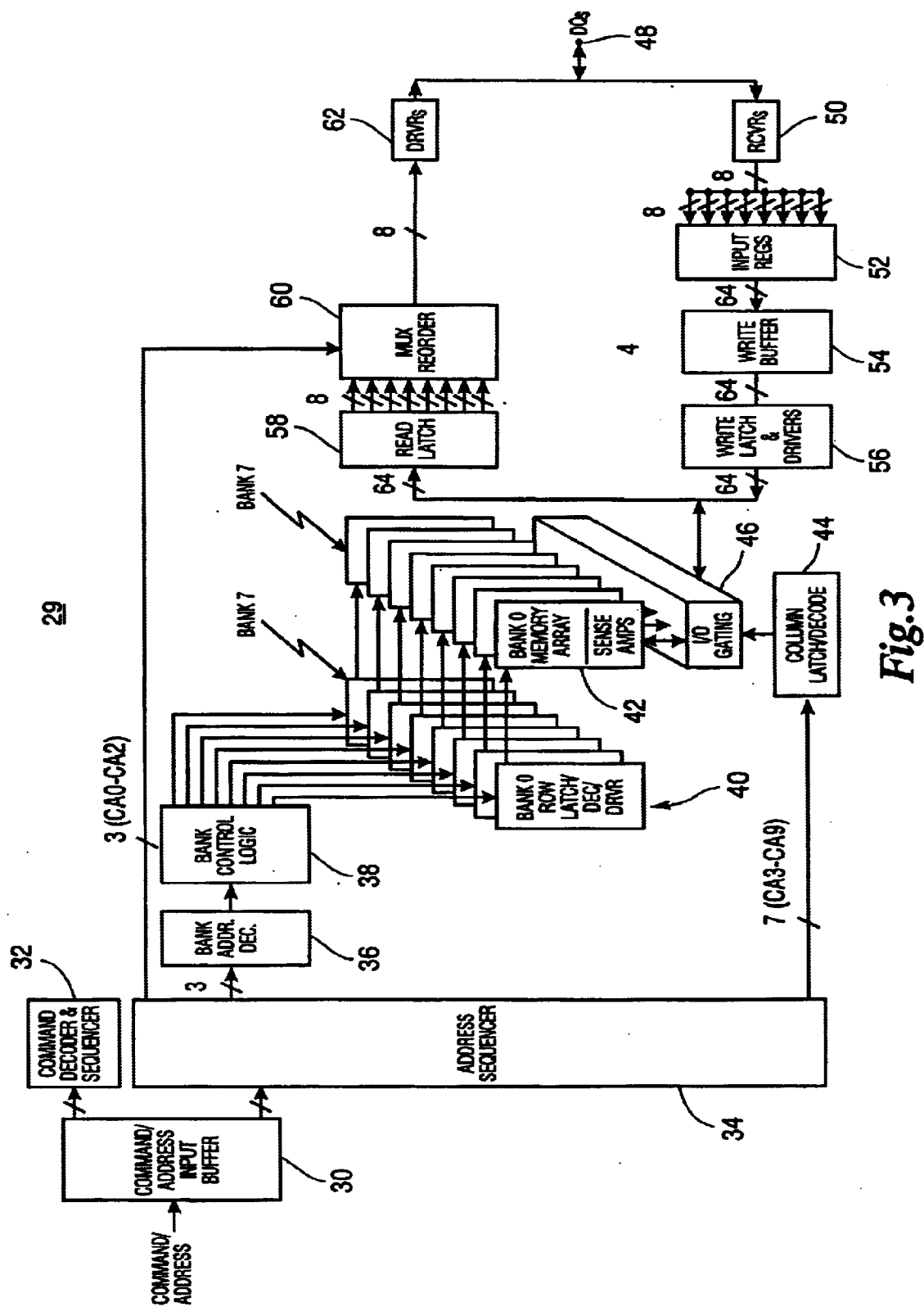
FIG. 3 is simplified block diagram of an architecture for implementing the burst read ordering of the present invention.

FIG. 3 illustrates a simplified block diagram of an architecture for a DRAM capable of implementing the burst read ordering of the present invention. The DRAM memory device 29 is comprised of a command/address input buffer 30 responsive to a command bus or command lines and an address bus or address lines. A command decoder and sequencer 32 and an address sequencer 34 are each responsive to the command/address input buffer 30.

A bank address decoder 36 is responsive to the address sequencer 34 while bank control logic 38 is responsive to the bank address decoder 36. A series of row latch/decoder/drivers 40 are responsive to the bank control logic 38 and the address sequencer 34. One row latch/decoder/driver 40 is provided for each memory array 42. Illustrated in FIG. 3 are eight memory arrays labeled bank 0 through bank 7. Accordingly, there are eight row latch/decoder/driver circuits 40 each responsive to one of bank 0 through bank 7.

A column latch/decode circuit 44 is responsive to the address sequencer 34. An I/O gating circuit 46 is responsive to the column latch/decode circuit 44 for controlling sense amplifiers within each of the memory arrays 42. The command/address input buffer 30, command decoder and sequencer 32, address sequencer 34, bank address decoder 36, bank control logic 38, the row latch/decoder/drivers 40, column latch decode circuit 44 and I/O gating circuit 46 are considered to be a first plurality of peripheral devices responsive to the command bus and the address bus. The description of the forgoing elements as a first plurality of peripheral devices is intended to provide a description of the presently preferred embodiment, and is not intended to limit the scope of the invention to only the recited devices. Those of ordinary skill in the art will recognize that other combinations of devices may be used to implement the first plurality of peripheral devices.

The DRAM 29 may be accessed through a plurality of data pads 48 for either a write operation or a read operation. For a write operation, data on data pads 48 is received by receivers 50 and passed to input registers 52. Write buffers 54 buffer the received data which is then input to a write latch and driver circuit 56 for input to the memory arrays 42 through the I/O gating circuit 46.

Data which is to be read from the memory arrays 42 is output through the I/O gating circuit 46 to a read latch 58. From the read latch 58, the information is input to a multiplexer/reorder circuit 60 which outputs the data onto the data pads 48 through drivers 62. The receivers 50, input registers 52, write buffers 54, write latch and driver circuit 56, I/O gating circuit 46, read latch 58, mux/reorder circuit 60 and drivers 62 comprise a second plurality of peripheral devices responsive to data. The description of the forgoing elements as a second plurality of peripheral devices is intended to provide a description of the presently preferred embodiment, and is not intended to limit the scope of the invention to only the recited devices. Those of ordinary skill in the art will recognize that other combinations of devices may be used to implement the second plurality of peripheral devices.

In general terms, the purpose of the reorder circuit 60 is to reorder a block of n-bit words output from the memory arrays 42 according to information in certain address bits. As seen in FIG. 3, there are eight, 8 bit words available at the input of mux/reorder circuit 60. Mux/reorder circuit 60 also receives the three least significant bits of the column address (CA0–CA2). Those three least significant bits identify the most critical word in the block of eight, 8 bit words to identify the word to be output first and where the wrap is to begin, i.e., the read begins with the critical word and if the critical word is any word other than the word at position 0, the read wraps around from position 7 to position 0 to complete the read.

More particularly, and in accordance with a preferred embodiment of the invention, when a read command is received, the value on the bank address inputs BA0 and BA1 (not shown) selects one of the memory arrays 42. Address information is then received which identifies a row or rows within each array 42. The address provided on inputs A3 through Ai (where i equals 8 for a ×16 part, 9 for an ×8 part and 10 for an ×4 part) selects the starting column location. Referring to FIG. 3, the values on inputs A0 through Ai for a ×8 part are CA3–CA9. The information in the least significant bits (CA0–CA2) is input to the mux/reorder circuit 60. Those values are available at inputs A0 through A2. That information identifies the most critical word which is output first by the mux/reorder circuit 60. FIGS. 4A, 4B, and 4C illustrate the addressing for a 512 megabit ×4 part, ×8 part, and an ×16 part, respectively.

For a write operation, the bank is identified in the same manner as for a read operation. Similarly, the starting column address is identified in the same manner. However, during a write operation, the signals available at inputs A0–A2 are ignored and assumed to be low.

The present invention is an addressing scheme that allows reads to incorporate interleaved burst mode so that the critical word is available to the controller while writes are simplified to a start sequential burst. In a preferred embodiment, access to the DRAM is always with a burst length of 8 bits. All write bursts are indexed to starting locations equal to CA0=0, CA1=0 and CA2=0. For reads, CA0, CA1 and CA2 specify the first data word read from the DRAM 29. The remaining seven data words are read as shown in Table 1.

TABLE 1

WRITE AND READ INTERLEAVE SEQUENCES

| Starting Column (CA0-CA1-CA2) | Data Word Write Sequence | Data Word Read Sequence |
| --- | --- | --- |
| 000 | 0-1-2-3-4-5-6-7 | 0-1-2-3-4-5-6-7 |
| 001 | 0-1-2-3-4-5-6-7 | 1-0-3-2-5-4-7-6 |
| 010 | 0-1-2-3-4-5-6-7 | 2-3-0-1-6-7-4-5 |
| 011 | 0-1-2-3-4-5-6-7 | 3-2-1-0-7-6-5-4 |
| 100 | 0-1-2-3-4-5-6-7 | 4-5-6-7-0-1-2-3 |
| 101 | 0-1-2-3-4-5-6-7 | 5-4-7-6-1-0-3-2 |
| 110 | 0-1-2-3-4-5-6-7 | 6-7-4-5-2-3-0-1 |
| 111 | 0-1-2-3-4-5-6-7 | 7-6-5-4-3-2-1-0 |

Figure 5:
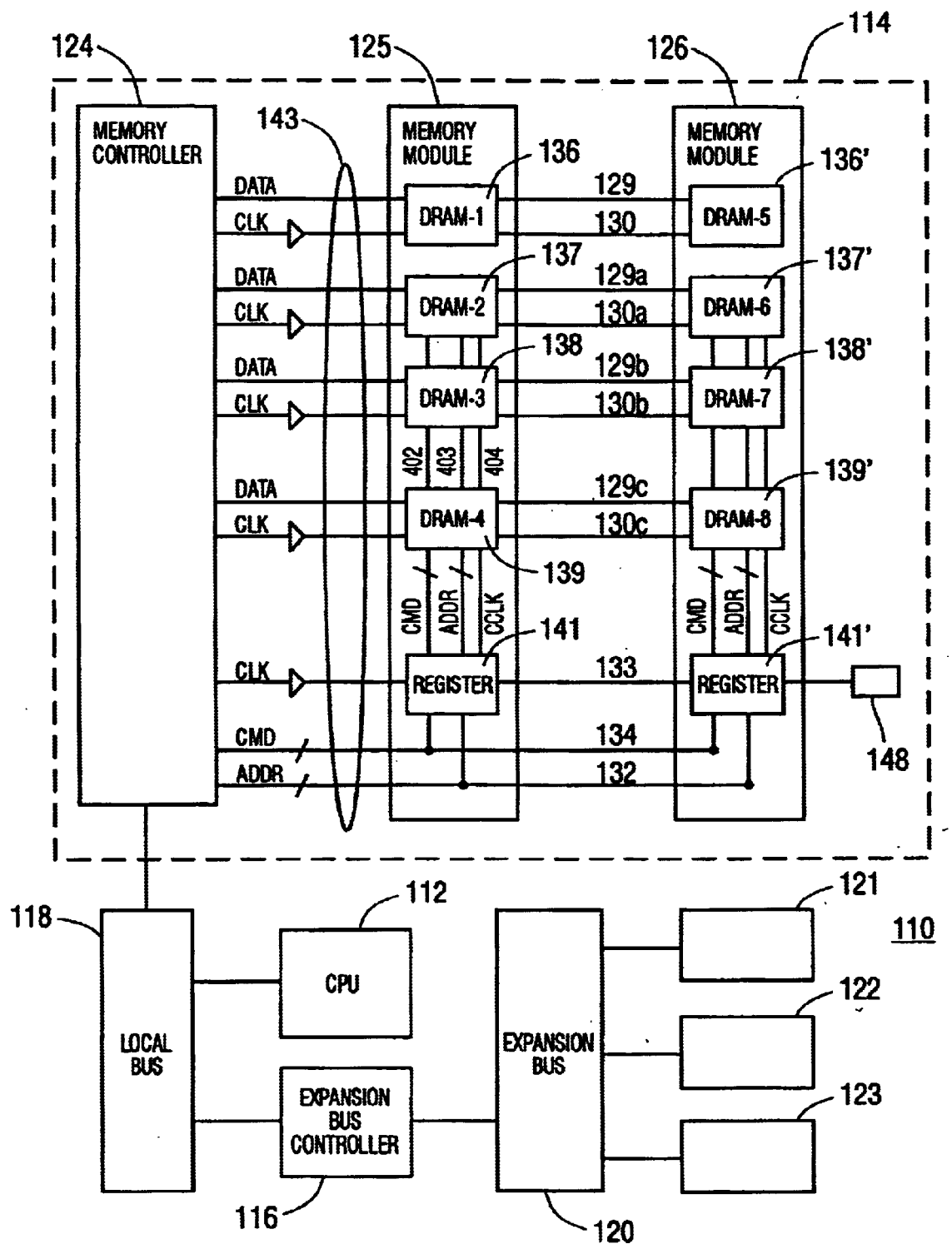
FIG. 5 is a simplified block diagram of a computer system in which the present invention may be used.

FIG. 5 is a block diagram of one example of a computer system 110 in which the present invention may be implemented. The computer system 110 includes a processor 112, a memory subsystem 114, and an expansion bus controller 116. The memory subsystem 114 and the expansion bus controller 116 are coupled to the processor 112 via a local bus 118. The expansion bus controller 116 is also coupled to at least one expansion bus 120, to which various peripheral devices 121–123 such as mass storage devices, keyboard, mouse, graphic adapters, and multimedia adapters may be attached. Processor 112 and memory subsystem 114 may be integrated on a single chip.

The memory subsystem 114 includes a memory controller 124 which is coupled to a plurality of memory modules 125, 126 via a plurality of signal lines 129, 130, 129b, 130b, 129c and 130c. The plurality of data signal lines 129, 129a, 129b, 129c are used by the memory controller 124 and the memory modules 125, 126 to exchanged data DATA. Addresses ADDR are signaled over a plurality of address signal lines 132, clock signals CLK are applied on a clock line 133, and commands CMD are signaled over a plurality of command signal lines 134. The memory modules 125, 126 include a plurality of memory devices 136–139, 136'–139' and a register 141, 141', respectively. Each memory device 136–139, 136'–139' may be a high speed synchronous memory device. Although only two memory modules 125, 126 and associated signal lines 129–129c, 130–130c are shown in FIG. 5, it should be noted that any number of memory modules can be used.

The plurality of signal lines 129–129c, 130–130c, 132, 133, 134 which couple the memory modules 125, 126 to the memory controller 124 are known as the memory bus 143. The memory bus 143 may have additional signal lines which are well known in the art, for example chip select lines, which are not illustrated for simplicity. Each column of memory devices 136–139, 136'–139' spanning the memory bus 143 is known as a rank of memory. Generally, single side memory modules, such as the ones illustrated in FIG. 5, contain a single rank of memory. However, double sided memory modules containing two ranks of memory may also be used.

Read data is output serially synchronized to the clock signal CLK, which is driven across a plurality of clock signal lines, 130, 130a, 130b, 130c. Write data is input serially synchronized to the clock signal CLK, which is driven across the plurality of clock signal lines 130, 130a, 130b, 130c by the memory controller 124. Commands and addresses are also clocked using the clock signal CLK which is driven by the memory controller 124 across the registers 141, 141' of the memory modules 125, 126, respectively, to a terminator 148. The command, address, and clock signal lines 134, 132, 133, respectively, are directly coupled to the registers 141, 141' of the memory modules 125, 126, respectively. The registers 141, 141' buffer those signals before they are distributed to the memory devices 136–139, 136'–139' of the memory modules 125, 126, respectively.

While the present invention has been described in conjunction with preferred embodiments thereof, those of ordinary skill in the art will recognize that many modifications and variations are possible. Such modifications and variations fall within the scope of the present invention which is limited only by the following claims.

What is claimed is:

1. A memory device, comprising:
   a plurality of arrays of memory cells;
   a plurality of peripheral devices for reading information out of and for writing information into said plurality of memory cells, said peripheral devices comprising:
   a reorder circuit responsive to certain address bits for ordering bits received from said plurality of arrays; and
   an address sequencer for routing certain of said address bits to said reorder circuit during a read operation, said address sequencer ignoring said certain of said address bits during a write operation.

2. The memory device of claim 1 wherein said address sequencer routes at least the least significant two bits of the column address.

3. The memory device of claim 1 wherein said reorder circuit receives a block of n bit words from said plurality of arrays of memory cells and outputs a particular n bit word in response to the identification of said particular n bit word by said certain address bits.

4. The memory device of claim 1 wherein said memory device includes a DRAM.

5. A memory device responsive to command lines, address lines, and data lines, comprising:
   a plurality of arrays of memory cells;
   a first plurality of peripheral devices responsive to said command lines and said address lines; and
   a second plurality of peripheral devices responsive to said data lines, said second plurality of peripheral devices comprising:
   a circuit responsive during a read operation to certain address bits for ordering bits received from said plurality of arrays, said circuit being non-responsive during a write operation to said certain address bits.

6. The memory device of claim 5 wherein said first plurality of peripheral devices includes a second circuit for routing certain of said address bits to said circuit during a read operation.

7. The memory device of claim 6 wherein said second circuit routes at least the least significant two bits of the column address.

8. The memory device of claim 6 wherein said second circuit ignores said certain of said address bits during a write operation.

9. The memory device of claim 5 wherein said circuit receives a block of n bit words from said plurality of arrays of memory cells and outputs a particular n bit word in response to the identification of said particular n bit word by said certain address bits.

10. The memory device of claim 5 wherein said memory device includes a DRAM.

11. A system comprising:
a processor;
a memory controller responsive to said processor;
a first bus interconnecting said processor and said memory controller;
a plurality of memory devices; and
a second bus interconnecting said memory controller and said plurality of memory devices, each memory device comprising:
a plurality of arrays of memory cells;
a plurality of peripheral devices for reading information out of and for writing information into said plurality of memory cells, said peripheral devices comprising:
a reorder circuit responsive to certain address bits for ordering bits received from said plurality of arrays; and
an address sequencer for routing certain of said address bits to said reorder circuit during a read operation, said address sequencer ignoring said certain of said address bits during a write operation.

12. The system of claim 11 wherein said address sequencer routes at least the least significant two bits of the column address.

13. The system of claim 11 wherein said reorder circuit receives a block of n bit words from said plurality of arrays of memory cells and outputs a particular n bit word in response to the identification of said particular n bit word by said certain address bits.

14. The system of claim 11 wherein said memory device includes a DRAM.

15. A system comprising:
a processor;
a memory controller responsive to said processor;
a first bus interconnecting said processor and said memory controller;
a plurality of memory devices; and
a second bus interconnecting said memory controller and said plurality of memory devices, each memory device comprising:
a plurality of arrays of memory cells;
a first plurality of peripheral devices responsive to command and address signals; and
a second plurality of peripheral devices responsive to data, said second plurality of peripheral devices comprising:
a circuit responsive during a read operation to certain address bits for ordering bits received from said plurality of arrays, said circuit being non-responsive during a write operation to said certain address bits.

16. The system of claim 15 wherein said first plurality of peripheral devices includes a second circuit for routing certain of said address bits to said circuit during a read operation.

17. The system of claim 16 wherein said second circuit routes at least the least significant two bits of the column address.

18. The system of claim 16 wherein said second circuit ignores said certain of said address bits during a write operation.

19. The system of claim 15 wherein said circuit receives a block of n bit words from said plurality of arrays of memory cells and outputs a particular n bit word in response to the identification of said particular n bit word by said certain address bits.

20. The system of claim 15 wherein said memory device includes a DRAM.

21. A method, comprising:
outputting a block of n-bit words from a plurality of memory arrays in response to a row address and certain bits of a column address;
controlling the order of output from the memory device of the n-bit words in response to certain other bits of the column address; and
inputting a block of n-bit words into said plurality of memory arrays in response to a row address and certain bits of a column address, wherein said certain other bits of the column address are ignored during said inputting.

22. A method of accessing a DRAM, comprising:
using the values on the bank address inputs to select an array bank;
using the column address provided on inputs A3–Ai, where i equals a maximum column address, to identify a starting column location for one of a read and a write access;
using the column address provided on inputs A0–A2 to identify a burst order for a read access; and
ignoring the column address provided on inputs A0–A2 during a write access.

23. The method of claim 22 wherein said using the column address comprises:
retrieving one or more data words from said array bank; and
outputting said one or more data words according to said identified burst order.

24. The method of claim 22 wherein said ignoring the column address comprises:
receiving one or more data words; and
writing said one or more data words into said array bank in the same order of receipt.

* * * * *

UNITED STATES PATENT AND TRADEMARK OFFICE
CERTIFICATE OF CORRECTION

PATENT NO.    : 6,779,074 B2
DATED         : August 17, 2004
INVENTOR(S)   : Jeffery W. Janzen It is certified that error appears in the above-identified patent and that said Letters Patent is hereby corrected as shown below:

Column 3,
Line 3, delete "Implementation" and insert therefore -- implementation --.
Line 3, after "possible" insert -- . --.
Line 64, delete "latch decode" and insert therefore -- latch/decode --.

Column 5,
Line 37, after "130," first occurrence, insert -- 129a, 130a --.
Line 40, delete "exchanged" and insert therefore -- exchange --.

Signed and Sealed this

Twenty-first Day of December, 2004

JON W. DUDAS
*Director of the United States Patent and Trademark Office*